US011658168B2

(12) United States Patent
Xue et al.

(10) Patent No.: US 11,658,168 B2
(45) Date of Patent: May 23, 2023

(54) FLASH MEMORY WITH IMPROVED BANDWIDTH

(71) Applicant: Alibaba Group Holding Limited, George Town (KY)

(72) Inventors: Fei Xue, Sunnyvale, CA (US); Shuangchen Li, Sunnyvale, CA (US); Dimin Niu, Sunnyvale, CA (US); Hongzhong Zheng, Sunnyvale, CA (US)

(73) Assignee: Alibaba Group Holding Limited ( * ) Notice: Subject to any disclaimer, the term of this patent is extended or adjusted under 35 U.S.C. 154(b) by 463 days.

(21) Appl. No.: 16/985,672

(22) Filed: Aug. 5, 2020

(65) Prior Publication Data

US 2022/0045044 A1 Feb. 10, 2022

(51) Int. Cl.
H01L 25/18 (2006.01)
H01L 25/065 (2023.01)
H01L 25/00 (2006.01)
G11C 16/26 (2006.01)
G11C 16/24 (2006.01)
G11C 16/04 (2006.01)

(52) U.S. Cl.
CPC .......... *H01L 25/18* (2013.01); *G11C 16/0483* (2013.01); *G11C 16/24* (2013.01); *G11C 16/26* (2013.01); *H01L 25/0657* (2013.01); *H01L 25/50* (2013.01); *H01L 2225/06541* (2013.01)

(58) Field of Classification Search
CPC ....... H01L 25/0657; H01L 2225/06541; H01L 25/50; H01L 25/18
See application file for complete search history.

(56) References Cited

U.S. PATENT DOCUMENTS

| 8,630,114 | B2 | | 1/2014 | Lue | |
|---|---|---|---|---|---|
| 9,230,677 | B2 | | 1/2016 | Lee | |
| 9,401,371 | B1 | | 7/2016 | Lee | |
| 9,432,298 | B1 | * | 8/2016 | Smith | .................. H04L 49/9057 |
| 11,069,400 | B1 | * | 7/2021 | O | .......................... G11C 11/4082 |
| 11,081,167 | B1 | * | 8/2021 | Yabe | ...................... G11C 7/065 |
| 11,081,474 | B1 | * | 8/2021 | Hoang | .................... G11C 16/10 |
| 11,244,718 | B1 | * | 2/2022 | Xue | ....................... G11C 11/4085 |
| 11,410,949 | B2 | * | 8/2022 | Lee | ...................... H01L 21/6835 |
| 2012/0129301 | A1 | * | 5/2012 | Or-Bach | .............. H01L 21/8221 438/129 |
| 2014/0140138 | A1 | * | 5/2014 | Tran | ...................... G11C 29/021 365/185.18 |
| 2014/0264235 | A1 | * | 9/2014 | Gong | ................... H01L 23/5383 257/421 |
| 2015/0348945 | A1 | * | 12/2015 | Or-Bach | ......... H01L 21/823828 257/384 |
| 2017/0364469 | A1 | * | 12/2017 | Crisp | ...................... G11C 5/025 |

(Continued)

*Primary Examiner* — Jaehwan Oh
(74) *Attorney, Agent, or Firm* — Van Pelt, Yi & James LLP

(57) ABSTRACT

A flash memory device includes a plurality of flash memory cell arrays, wherein: a flash memory cell array in the plurality of flash memory cell arrays comprises a plurality of layers of flash memory cell planes; and a flash memory cell plane includes a plurality of flash memory cells. The flash memory device further includes a logic circuitry coupled to the plurality of flash memory cell arrays, configured to perform operations using the plurality of flash memory cell arrays; and a sensing circuitry configured to access a corresponding flash memory cell plane among the plurality of flash memory cell planes.

21 Claims, 8 Drawing Sheets

(56) References Cited

U.S. PATENT DOCUMENTS

| | | | |
|---|---|---|---|
| 2018/0341613 A1* | 11/2018 | Yudanov | G06F 13/4068 |
| 2019/0043836 A1* | 2/2019 | Fastow | H01L 27/11573 |
| 2019/0164834 A1* | 5/2019 | Or-Bach | H01L 21/84 |
| 2019/0304978 A1* | 10/2019 | Wang | H01L 27/0688 |
| 2020/0243486 A1* | 7/2020 | Quader | G06F 12/0246 |
| 2020/0381397 A1* | 12/2020 | Yu | H01L 24/08 |
| 2020/0395328 A1* | 12/2020 | Fastow | H01L 27/11582 |

\* cited by examiner

| Plane 1 | Plane 2 |
| --- | --- |
| Plane 3 | Plane 4 |
| Plane 5 | Plane 6 |
| Plane 7 | Plane 8 |

FLASH MEMORY WITH IMPROVED BANDWIDTH

BACKGROUND OF THE INVENTION

Flash memory devices such as NAND devices provide high density, low cost, non-volatile storage. While the density of NAND flash memory has been improved rapidly, input/output (I/O) bandwidth remains a bottleneck for extending NAND applications. Much work has been done on improving NAND bandwidth, mainly focused on improving the NAND cell process to make cells more uniform in order to reduce sensing time, or improving wordline (WL) and bitline (BL) processes as well as voltage driver designs to reduce metal line renting time. The bandwidth, however, has not kept up with application requirements. Therefore, flash memory with higher bandwidth is desired. It would also be useful if improvements to the flash memory design could be made without drastically altering the cells themselves.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
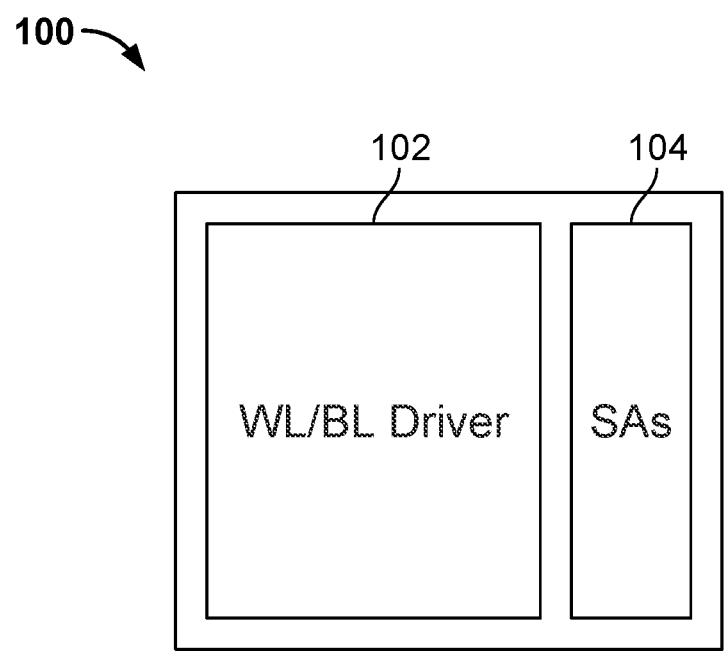
FIG. 1 is a diagram illustrating an example of a conventional under array circuit.

In conventional NAND memory devices, a memory cell die can be divided into smaller areas, referred to as planes. Multiple planes can be placed on top of a under array circuit. Each plane has its own input/output interface supporting read/write operations. FIG. 1 is a diagram illustrating an example of a conventional under array circuit. In this example, under array circuit 100 includes a logic circuitry portion 102 connected with a sensing circuitry portion 104. In this example, the logic circuitry portion includes a set of wordline/bitline drivers that are connected to the wordlines/bitlines of the memory device and configured to provide pulses to the wordlines/bitlines. The sensing circuitry portion includes sensing circuits (e.g., sense amplifiers) configured to detect (sense) electrical charge levels in the memory cells and facilitate in the determination of data that is stored in the memory cells. In traditional NAND design, the wordline/bitline driver portion occupies over 80% of the under array circuit area, and the sensing circuitry portion plus some additional circuits for other uses occupy the remaining area. Typically, there is one set of sensing circuitry per plane to support read/write operations.

To accommodate more planes on top of the under array circuit, the circuitry becomes more complex, and the areas for the logic circuitry portion and the sensing circuitry portion both need to be increased. The resulting under array circuit size would therefore increase, which would increase cost. To put it another way, for a given under array circuit size, the number of planes that can be implemented on existing NAND devices is limited. Currently, NAND devices are typically dual plane (i.e., two planes are placed on top of the under array circuit) or quad plane (i.e., four planes are placed on top of the under array circuit). Since read/write operations can be performed on each plane in parallel, a single plane device supports reading/writing of one page at a time, a dual plane device supports reading/writing of two pages at a time, a quad plane supports reading/writing of four pages at a time, and so on. Because the amount of area available for sensing circuits is limited, the number of planes that can be supported is also limited. As a result, input/output bandwidth for the device is limited as well.

A flash memory device is disclosed. The device includes a plurality of flash memory cell arrays, wherein: a flash memory cell array in the plurality of flash memory cell arrays comprises a plurality of layers of flash memory cell planes; and a flash memory cell plane includes a plurality of flash memory cells; a logic circuitry coupled to the plurality of flash memory cell arrays, configured to perform operations using the plurality of flash memory cell arrays; and a sensing circuitry that is configured to access in parallel individual flash memory cell planes in the plurality of flash memory cell arrays, wherein the sensing circuitry is formed in a separate die than the logic circuitry.

In some embodiments, the flash memory device further comprises a bitline (BL) circuitry, and wherein the sensing circuitry is attached to the BL circuitry using 3-dimensional (3D) wafer bonding.

In some embodiments, the flash memory device further comprises a BL circuitry that is connected to the top of the plurality of flash memory cell arrays, and wherein the sensing circuitry is attached to the BL circuitry using 3-dimensional (3D) wafer bonding.

In some embodiments, the sensing circuitry is attached to the logic circuitry using through silicon vias (TSVs).

In some embodiments, the flash memory cell is a NAND cell.

In some embodiments, the sensing circuitry further comprises a processing circuit.

In some embodiments, the flash memory device is used by a search application that directly searches data stored in the flash memory device.

In some embodiments, the flash memory device is used by a data streaming application, an encryption application, and/or a security application.

In some embodiments, the sensing circuitry provides an input/output (I/O) speed of 16 GB or more.

A method of manufacturing a flash memory device is disclosed. The method includes: providing a plurality of flash memory cell arrays, a logic circuitry, and a bitline (BL) circuitry; providing a sensing circuitry that is formed in a separate die than the logic circuitry, and that is configured to access in parallel individual cell planes of the flash memory cell arrays; and connecting the sensing circuitry to the logic circuitry or the bitline circuitry.

In some embodiments, the sensing circuitry is connected to the bitline circuitry, and connecting the sensing circuitry to the bitline circuitry includes attaching the sensing circuitry to the BL circuitry using 3-dimensional (3D) wafer bonding.

In some embodiments, the BL circuitry is connected to the top of the plurality of flash memory cell arrays, and wherein the sensing circuitry is attached to the BL circuitry using 3-dimensional (3D) wafer bonding.

In some embodiments, the sensing circuitry is connected to the logic circuitry; and connecting the sensing circuitry includes attaching the sensing circuitry to the logic circuitry using through silicon vias (TSVs).

In some embodiments, the flash memory cell is a NAND cell.

In some embodiments, the sensing circuitry further comprises a processing circuit.

Figure 2:
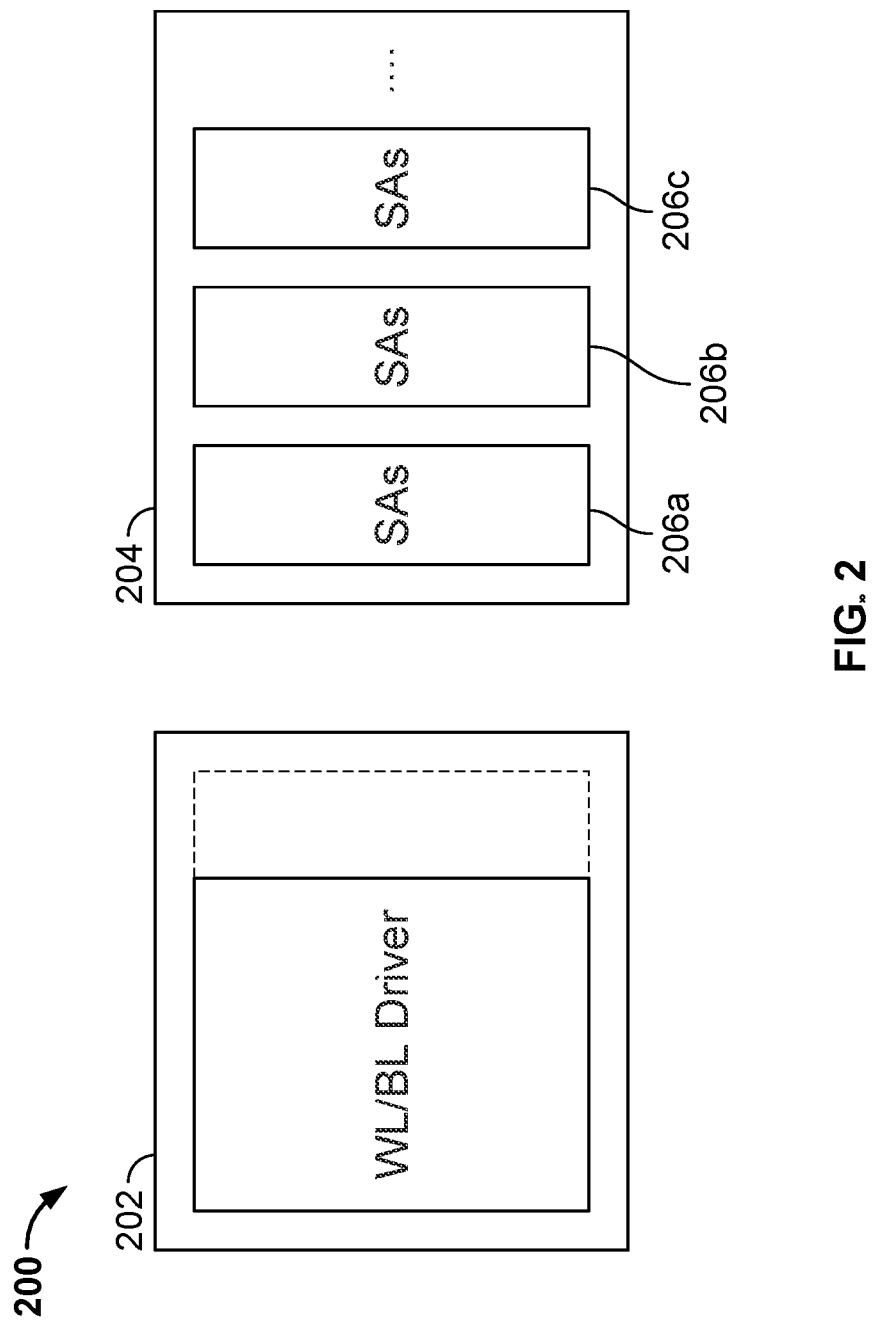
FIG. 2 is a block diagram illustrating an embodiment of an improved NAND device design.

To improve NAND device bandwidth, a design that implements sensing circuits on one or more separate dies is used in some embodiments. Such a design allows the device to implement a greater number of sensing circuits to support a greater number of planes. FIG. 2 is a block diagram illustrating an embodiment of an improved NAND device design. In this example, under array circuit 200 includes two dies. Specifically, die 202 is used to implement the logic circuitry, which includes circuits configured to perform operations using the flash memory cell arrays, such as read/write, controls, etc. Die 204 is used to implement the sensing circuits, which include circuits configured to access the memory cells, including to measure the string current associated with the cells, perform analog to digital conversion, and output the sensed results. Each sensing circuit (206a, 206b, 206c, etc.) is connected to the logic circuitry. Examples of the connections are described in greater detail below. By separating the sensing circuitry from the logic circuit and placing the sensing circuitry on a separate die, much more area can be allocated to implement more instances of sensing circuits, and additional area is gained by the logic circuitry, thus allowing a device to add more memory cell planes. In some embodiments, the device supports 8 to 16 planes, thereby improving bandwidth by 8 to 16 times compared to traditional NAND devices. In some embodiments, three-dimensional (3D) cell arrays (arrays with cells stacked in the vertical direction) are used to achieve greater bandwidth gain by including a high number of cells in each array. Memory cells in the 3D cell arrays can be accessed in parallel. In other words, individual cell planes have their own sets of I/O pins, allowing data to be read from or written to the cell planes in parallel. Because existing 3D cell arrays offered by manufacturers can be used without modifications to the array structures or manipulation of the NAND cells, high bandwidth can be achieved with minimal array process change.

Figure 3:
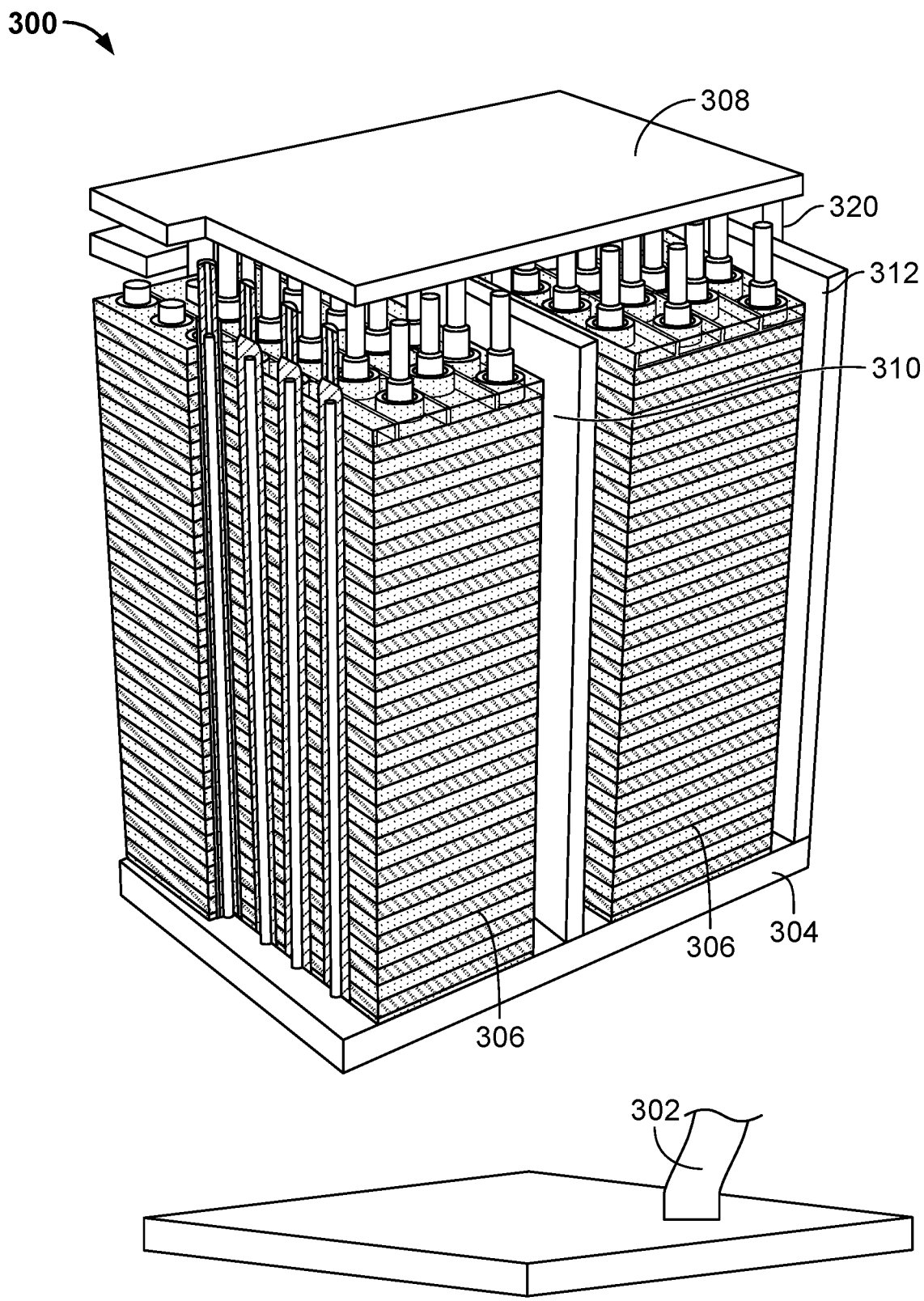
FIG. 3 is a diagram illustrating a three-dimensional view of an embodiment of a flash memory device.

FIG. 3 is a diagram illustrating a three-dimensional view of an embodiment of a flash memory device. In this example, device 300 includes a plurality of cell arrays 306. The cell arrays are three-dimensional, where each flash memory cell array includes multiple layers of flash memory cells. In each layer, there are multiple flash memory cells. The layers of flash memory cells are organized into cell planes. One way to organize the cell planes is to divide the area of the die into sections, where layers of cells in each section forms a separate plane. As shown, there are two separate cell areas (two stacks of cells each including multiple layers), which are organized into two planes. Each plane has its own set of sensing circuit and a set of one or more layers of flash memory cells. The sensing circuits of the planes can be accessed in parallel. Each sensing circuit can access the I/O interface on the device. The 3D cell arrays can be implemented using standard 3D flash memory cells (e.g., NAND cells).

As shown, the 3D flash memory cells are coupled to a bitline circuitry 308, which is configured to provide voltage to the memory cells. A plurality of pillars 320 connect the bitline circuitry and the memory cells electrically. Interlayer electrical connections such as staircase connections (not shown) can be made between individual layers in the 3D cell array. The flash memory cell arrays are separated by vertical isolation layers such as 310 and 312.

The flash memory cells in the cell arrays are connected to a logic circuitry 304, which implements operations to be performed on the flash memory cells, such as read/write, controls, etc.

Device 300 further includes a sensing circuitry 302 that is formed in a separate die. The sensing circuitry is configured to have the capability of accessing individual cell planes in parallel. Specifically, the accessing of the cell planes includes measuring current levels, performing analog to digital conversions, and outputting the sensed results. The sensing circuitry provides each cell plane with its own corresponding set of sensing circuit. These sensing circuits are configured to access individual cell planes in parallel. Although a single sensing circuitry plane is shown in the example, in some embodiments, multiple sensing circuitries formed on multiple dies can be included to provide more area for more sensing circuits and achieve greater bandwidth improvement. Although two cell arrays are shown for purposes of illustration, different numbers of cell arrays can be implemented in various embodiments. For example, there can be 8 or 16 cell arrays in some embodiments. The sensing circuitry is configured to be able to access the cell planes in the cell arrays in parallel.

Because semiconductor circuits are typically formed on one side of the die, sensing circuitry 302 and logic circuitry 304 are coupled using through silicon vias (TSVs) at desired locations. Other appropriate connection techniques can be used. This way, sensing circuitry 302 can be attached to the bottom side of logic circuitry 304. Bitline circuitry 308, memory cells 306, logic circuitry 304, and sensing circuitry 302 are electrically connected through pillars 320, interlayer connections, and TSVs (or other appropriate connection techniques).

Figure 4:
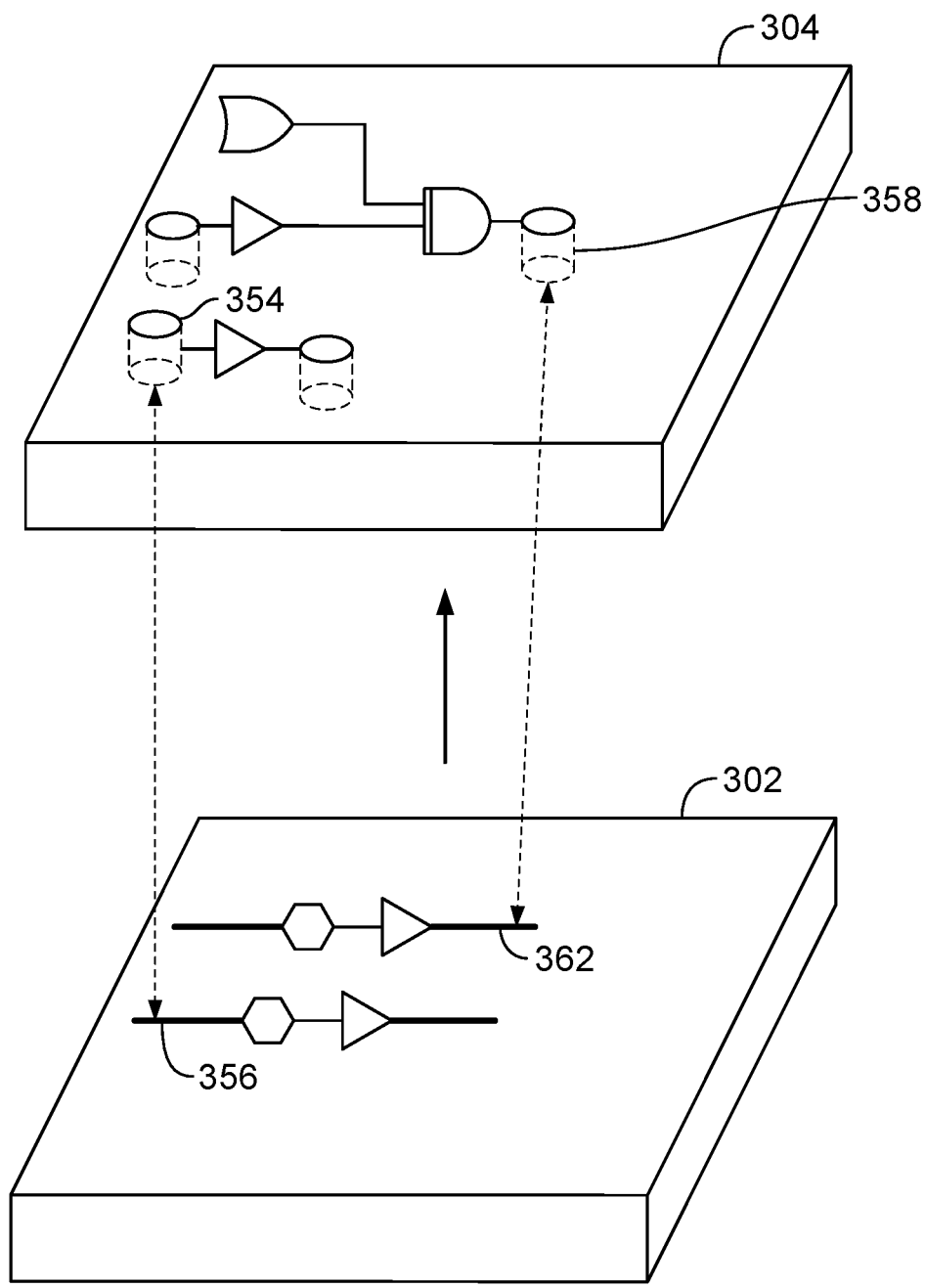
FIG. 4 is a diagram illustrating an example of a sensing circuitry and a logic circuitry coupled using through silicon vias.

FIG. 4 is a diagram illustrating an example of a sensing circuitry and a logic circuitry coupled using through silicon vias. In this example, holes (vias) such as 352 and 354 are drilled at appropriate locations on sensing circuitry 302. The vias on a die are filled with metal and form electrical connections by coming into contact with wires or other conductive features on another die. For example, via 354 in logic circuitry 304 can be electrically connected with wire 356 in sensing circuitry 302, and via 358 in logic circuitry 304 can be connected with wire 362 in sensing circuitry 302. Sensing circuitry 302 is attached to the bottom of logic circuitry 304. In some embodiments, additional sensing circuitries can be used, where each additional sensing circuitry die is attached to the bottom of a previous sensing circuitry die, and electrically connected to logic circuitry 304 using TSVs (and wires as appropriate) formed in the sensing circuitries and the logic circuitry.

Figure 5:
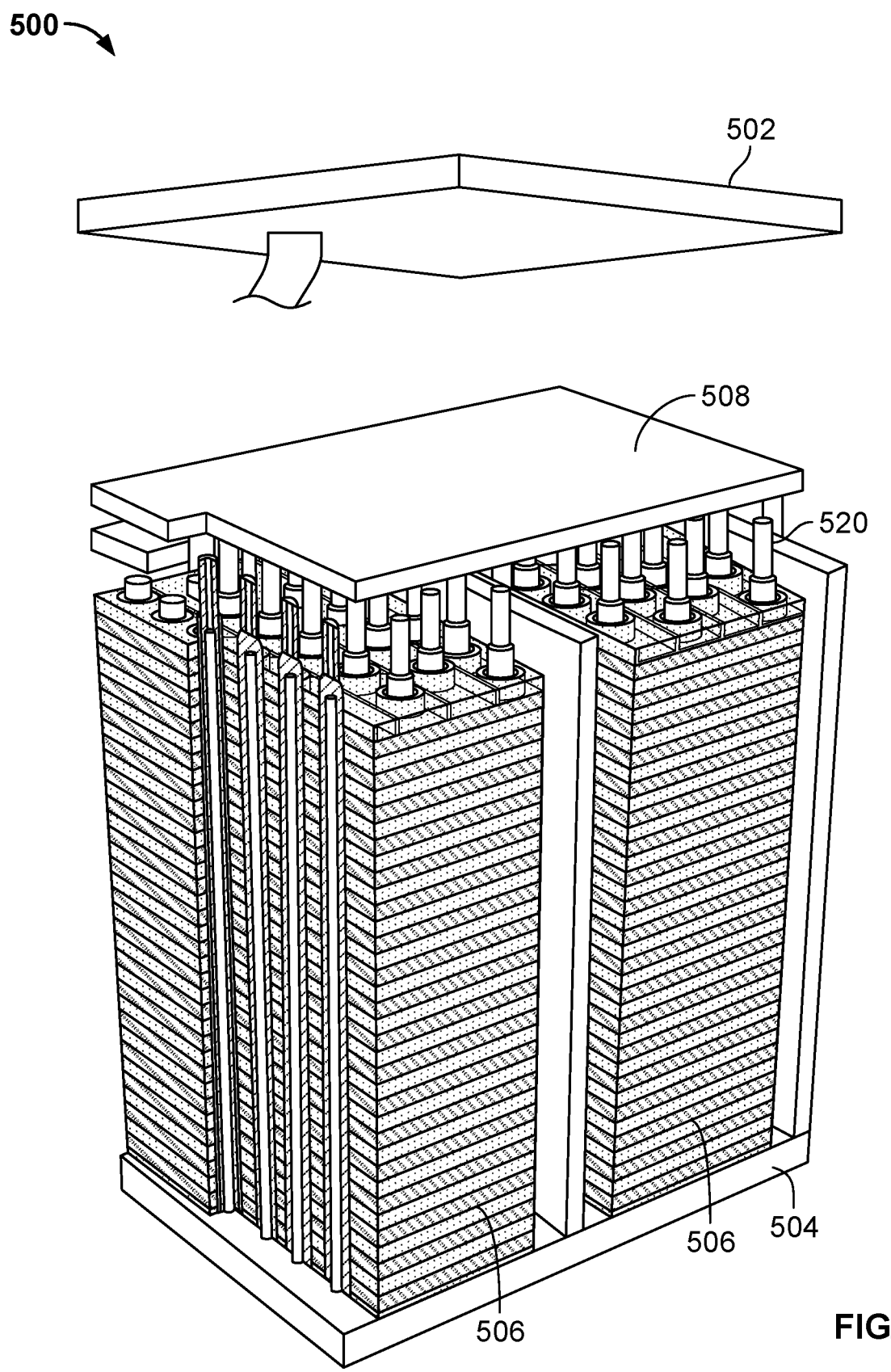
FIG. 5 is a diagram illustrating a three-dimensional view of another embodiment of a flash memory device.

FIG. 5 is a diagram illustrating a three-dimensional view of another embodiment of a flash memory device. In this example, device 500 includes a bitline circuitry 508, cell arrays 506, and logic circuitry 504 that are similar to device 300. In particular, the device includes a plurality of cell arrays 506, which are three-dimensional with multiple layers of flash memory cells. In each layer, there are multiple flash memory cells. The flash memory cells are organized into cell planes, where each plane has its own set of sensing circuitry and a set of one or more layers of flash memory cells. The sensing circuitries of the planes can be accessed in parallel. Each sensing circuitry can access the I/O interface on the device. Similar to cell arrays 306 of device 300, cell arrays 506 can be implemented using standard 3D flash memory cells (e.g., NAND cells).

A plurality of pillars 520 connect the bitline circuitry and the memory cells electrically. Interlayer electrical connections such as staircase connections (not shown) can be made between individual layers in the 3D cell array. The flash memory cell arrays are separated by one or more vertical isolation layers. Although two cell arrays are shown for purposes of illustration, different numbers of cell arrays can be implemented in various embodiments. For example, there can be 8 or 16 cell arrays in some embodiments.

The flash memory cells in the cell arrays are connected to a logic circuitry 504, which implements operations to be performed on the flash memory cells, such as read/write, controls, etc.

Device 500 further includes a sensing circuitry die 502 that is formed separately. Multiple sensing circuits are formed on the sensing circuitry die, where a set of sensing circuits has the capability of accessing cells in the corresponding plane. For example, in a dual-plane device, there are two sensing circuits on 502; in a quad-plane device, there are four sensing circuits on 502. In other embodiments, the numbers of sensing circuits can be eight, sixteen, etc. These sensing circuits can be accessed in parallel.

Figure 6:
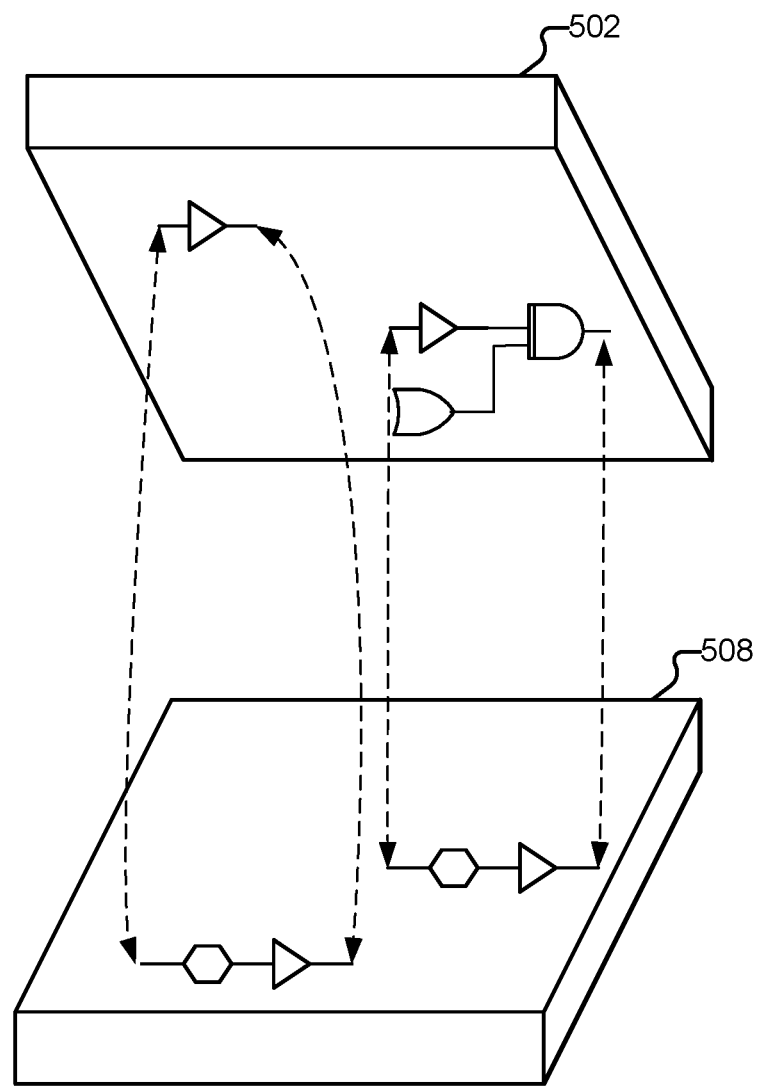
FIG. 6 is a diagram illustrating an example of a sensing circuitry and the bitline circuitry coupled using 3D wafer bonding techniques.

In this embodiment, sensing circuitry 502 is placed such that the sensing circuits are on the bottom side of the die. As will be described in greater detail below, sensing circuitry 502 and bitline circuitry 508 are attached in a face to face configuration using 3D wafer bonding techniques. Other appropriate connection techniques can be used. Bitline circuitry 508, memory cells 506, logic circuitry 504, and sensing circuitry 502 are electrically connected through pillars 520, interlayer connections, and 3D wafer bonding (or other appropriate connection techniques), FIG. 6 is a diagram illustrating an example of a sensing circuitry and the bitline circuitry coupled using 3D wafer bonding techniques. In this example, sensing circuitry 502 and bitline circuitry 508 are placed face to face (in other words, the sides with circuits face each other) and bonded together by gluing or other appropriate techniques. Where the bonds form, the circuits are electrically connected.

Figures 7A, 7B:
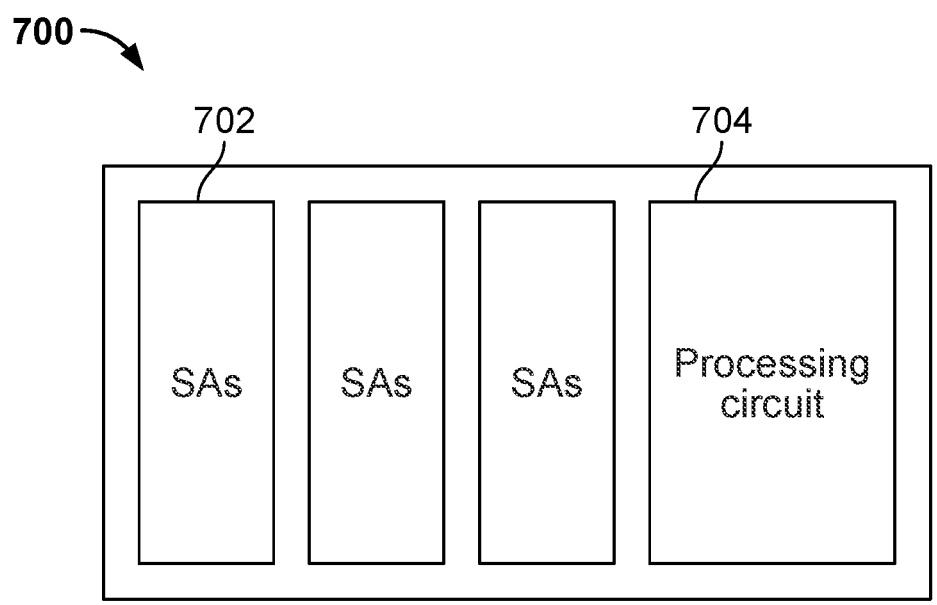
FIG. 7A is a block diagram illustrating an embodiment of a sensing circuitry that includes local processing circuitry.
FIG. 7B is a top view of an example of a flash memory device.

In some embodiments, additional logic can be added to the sensing circuitry as space permits. FIG. 7A is a block diagram illustrating an embodiment of a sensing circuitry that includes local processing circuitry. In this example, die 700 includes multiple sensing circuits 702. In the space that is left over, one or more processing circuits 704 can be added to provide additional logic for performing data processing on the device locally.

FIG. 7B is a top view of an example of a flash memory device. The die area is divided into multiple planes. In this example, there are eight planes. Different numbers of planes (2, 4, 16, etc.) can be implemented in other embodiments.

By separating the sensing circuitry from the rest of the NAND device circuitry, parallel access of many more NAND cell planes can be supported in the same device than conventional techniques, and bandwidth is greatly improved. In some cases, such NAND devices can achieve I/O bandwidth of 16 GB or more. Some applications that are not possible or difficult to implement using current flash memory technology are possible with the improved device. For example, because conventional NAND memory has low bandwidth, it does not effectually support searches. To conduct a search in conventional NAND memory, data is first placed in a faster (lower latency) memory and then search is performed on the faster memory. The requirement of a faster memory means that the architecture is more expensive to implement. With the improved NAND devices, searches can be conducted directly without requiring an additional faster memory. Streaming applications, encryption applications, and security applications are some other examples of applications that can be implemented more effectively with higher bandwidth NAND devices. The applications store data in the flash memory device, and directly access the data through the flash memory device without going through an intermediate, faster memory.

Figure 8:
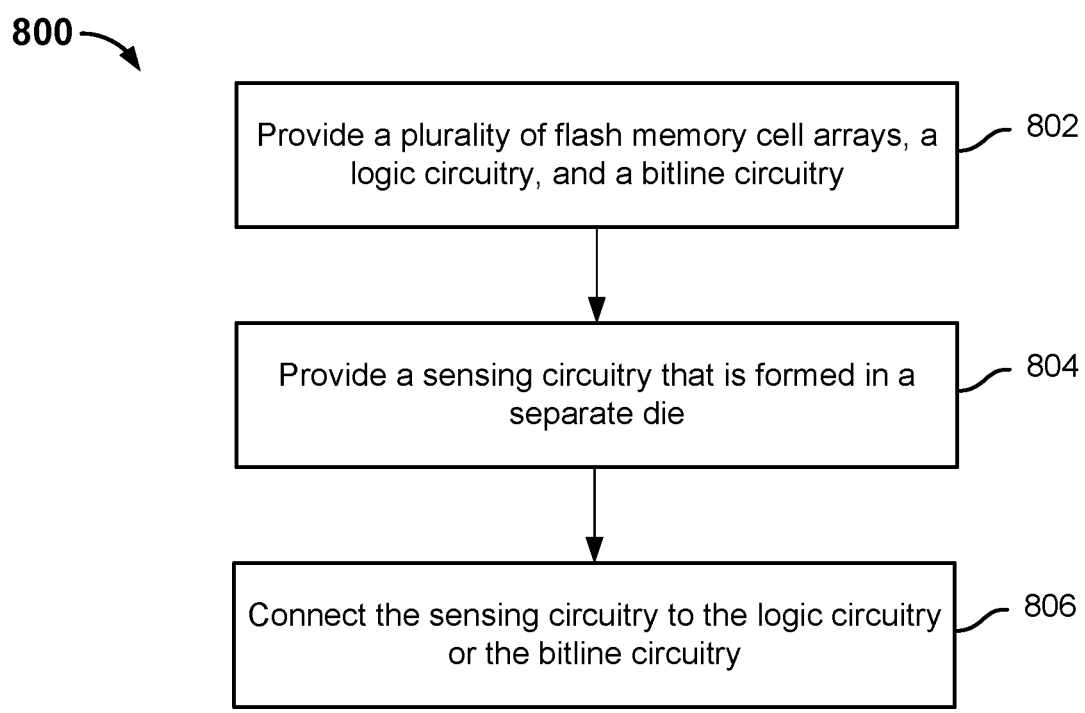
FIG. 8 is a flowchart illustrating an embodiment of a process for manufacturing a flash memory device.

FIG. 8 is a flowchart illustrating an embodiment of a process for manufacturing a flash memory device. Process 800 can be performed to manufacture a device such as 300 or 500.

At 802, a plurality of flash memory cell arrays, a logic circuitry, and a bitline circuitry are provided. In some embodiments, the flash memory cell arrays are 3D NAND cell arrays arranged in multiple layers of cell planes. The logic circuitry is coupled to the flash memory cell arrays, and is configured to perform operations such as read/write, controls, etc., using the flash memory cell arrays.

At 804, a sensing circuitry is provided. The sensing circuitry, which is formed in a separate die than the logic circuitry, is configured to have the capability of accessing in parallel individual layers of flash memory cell planes in the plurality of flash memory cell arrays.

At 806, the sensing circuitry is connected to the logic circuitry or the bitline circuitry. As described above, the sensing circuitry can be connected to the logic circuitry using TSVs, or to the bitline circuitry using 3D wafer bonding. Other appropriate connection techniques can be used.

Process 800 allows the use of conventional flash memory cell arrays without modifying or manipulating the memory cells themselves. Compared to other techniques for bandwidth improvement that require modification and/or manipulation of memory cells, the above technique requires minimal array process change and is easier and less expensive to implement.

A flash memory device and its associated manufacturing process have been disclosed. The device has improved I/O bandwidth, and the process requires minimal changes to the cell arrays.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A flash memory device, comprising:
a plurality of flash memory cell arrays, wherein:
a flash memory cell array in the plurality of flash memory cell arrays comprises a plurality of layers of flash memory cells; and
the plurality of layers of flash memory cells are organized into a plurality of flash memory cell planes;
a logic circuitry coupled to the plurality of flash memory cell arrays, configured to perform operations using the plurality of flash memory cell arrays; and
a sensing circuitry comprising a plurality of sensing circuits, wherein a sensing circuit in the plurality of sensing circuits is configured to access a corresponding flash memory cell plane among the plurality of flash memory cell planes, wherein:
the plurality of sensing circuits are formed in one or more separate dies than the logic circuitry.

2. The flash memory device of claim 1, wherein
the plurality of flash memory cell planes are configured to be accessed by the plurality of sensing circuits in parallel.

3. The flash memory device of claim 1, further comprising a bitline (BL) circuitry, and wherein the sensing circuitry is attached to the BL circuitry using 3-dimensional (3D) wafer bonding.

4. The flash memory device of claim 1, further comprising a bitline (BL) circuitry that is connected to the top of the plurality of flash memory cell arrays, and wherein the sensing circuitry is attached to the BL circuitry using 3-dimensional (3D) wafer bonding.

5. The flash memory device of claim 1, wherein the sensing circuitry is attached to the logic circuitry using through silicon vias (TSVs).

6. The flash memory device of claim 1, wherein the sensing circuitry is attached to the bottom of the plurality of flash memory cell arrays using through silicon vias (TSVs).

7. The flash memory device of claim 1, wherein a flash memory cell is a NAND cell.

8. The flash memory device of claim 1, wherein the sensing circuitry further comprises a processing circuit.

9. The flash memory device of claim 1, wherein the flash memory device is used by a search application that directly searches data stored in the flash memory device.

10. The flash memory device of claim 1, wherein the flash memory device is used by a data streaming application, an encryption application, and/or a security application.

11. The flash memory device of claim 1, further comprising a processing circuit configured to perform data processing on the flash memory device locally.

12. The flash memory device of claim 1, wherein the sensing circuitry provides an input/output (I/O) speed of 16 GB or more.

13. A method of manufacturing a flash memory device, comprising:
providing a plurality of flash memory cell arrays, a logic circuitry, and a bitline (BL) circuitry, wherein:
a flash memory cell array in the plurality of flash memory cell arrays comprises a plurality of layers of flash memory cells; and
the plurality of layers of flash memory cells are organized into a plurality of flash memory cell planes;
providing a sensing circuitry that is formed in a separate die than the logic circuitry, wherein:
the sensing circuitry includes a plurality of sensing circuits;
a sensing circuit in the plurality of sensing circuits is configured to access a corresponding flash memory cell plane among the plurality of flash memory cell planes;
the plurality of sensing circuits are formed in one or more separate dies than the logic circuitry; and
the plurality of flash memory cell planes are configured to be accessed by the plurality of sensing circuits in parallel; and
connecting the sensing circuitry to the logic circuitry or the bitline circuitry.

14. The method of claim 13, wherein the plurality of flash memory cell planes are configured to be accessed by the plurality of sensing circuits in parallel.

15. The method of claim 13, wherein:
the sensing circuitry is connected to the bitline circuitry, and connecting the sensing circuitry to the bitline circuitry includes attaching the sensing circuitry to the BL circuitry using 3-dimensional (3D) wafer bonding.

16. The method of claim 13, wherein the BL circuitry is connected to the top of the plurality of flash memory cell arrays, and wherein the sensing circuitry is attached to the BL circuitry using 3-dimensional (3D) wafer bonding.

17. The method of claim 13, wherein:
the sensing circuitry is connected to the logic circuitry; and
connecting the sensing circuitry includes attaching the sensing circuitry to the logic circuitry using through silicon vias (TSVs).

18. The method of claim 17, wherein:
the sensing circuitry is attached to the bottom of the plurality of flash memory cell arrays; and
connecting the sensing circuitry includes attaching the sensing circuitry to the bottom of the plurality of flash memory cell arrays using through silicon vias (TSVs).

19. The method of claim 13, wherein a flash memory cell is a NAND cell.

20. The method of claim 13, wherein the sensing circuitry further comprises a processing circuit.

21. The method of claim 13, further comprising adding a processing circuit configured to perform data processing on the flash memory device locally.

\* \* \* \* \*

UNITED STATES PATENT AND TRADEMARK OFFICE
CERTIFICATE OF CORRECTION

| | | |
|---|---|---|
| PATENT NO. | : 11,658,168 B2 | Page 1 of 1 |
| APPLICATION NO. | : 16/985672 | |
| DATED | : May 23, 2023 | |
| INVENTOR(S) | : Fei Xue et al. | |

It is certified that error appears in the above-identified patent and that said Letters Patent is hereby corrected as shown below:

On the Title Page

Item (73), after "Alibaba Group Holding Limited", insert --, (KY)--.

Signed and Sealed this
Eighth Day of October, 2024

Katherine Kelly Vidal
*Director of the United States Patent and Trademark Office*